United States Patent [19]

Mellitz

[11] Patent Number: 5,017,863
[45] Date of Patent: May 21, 1991

[54] ELECTRO-EMISSIVE LASER STIMULATED TEST

[75] Inventor: Richard I. Mellitz, Pepperell, Mass.

[73] Assignee: Digital Equipment Corporation, Maynard, Mass.

[21] Appl. No.: 424,396

[22] Filed: Oct. 20, 1989

[51] Int. Cl.$^5$ .................. G01R 31/28; G01R 31/02
[52] U.S. Cl. .................. 324/158 R; 324/158 D; 324/158 F; 324/73.1; 324/71.3
[58] Field of Search ............ 324/158 R, 158 D, 71.3, 324/73.1; 250/306, 310, 311, 492.1; 356/394, 398; 313/542

[56] References Cited

U.S. PATENT DOCUMENTS

| | | | |
|---|---|---|---|
| 4,229,693 | 10/1980 | Irick et al. | 324/73 |
| 4,240,750 | 12/1980 | Kurtz et al. | 356/394 |
| 4,565,966 | 1/1986 | Burr et al. | 324/73 |
| 4,703,260 | 10/1987 | Beha et al. | 324/158 R |
| 4,721,910 | 1/1988 | Bokor et al. | 324/158 R |
| 4,829,243 | 5/1989 | Woodard, Sr. et al. | 324/158 D |
| 4,843,329 | 6/1989 | Beha et al. | 324/158 R |
| 4,843,330 | 6/1989 | Golladay et al. | 324/158 R |
| 4,891,578 | 2/1990 | Doemens | 324/73.1 |

OTHER PUBLICATIONS

Woodward et al., "Voltage Contrast Electron Beam Testing Experiments on Very Large Scale Integrated Circuit Chip Packaging Substrates", J. Vac. Sci. Tech., Nov./Dec. 1988, p. 1966.
Paul May et al., "Laser Pulsed E-Beam System for High-Speed I.C. Testing", Abstract No. 129, Extended Abstracts, The Electrochem. Soc., Spring Meet., May 10, 1987.
Weiner et al., "Picosecond Temporal Resolution Photoemissive Sampling", Applied Physics Letters, May 1987.
R. B. Marcus et al., "High-Speed Electrical Sampling by fs Photoemission", Applied Physics Letters, Aug. 11, 1986, p. 357.

*Primary Examiner*—Kenneth Wieder
*Assistant Examiner*—Vinh P. Nguyen
*Attorney, Agent, or Firm*—Arnold, White & Durkee

[57] ABSTRACT

A test arrangement for printed wiring boards or the like employs a scanned laser beam which impinges upon a photoemissive grid mounted close to the board under test. The laser beam causes the grid to locally emit electrons which are attracted toward the board due to an electric field between the grid and a conductive plane behind the board. The spacing between the grid and the workpiece is very small so the electron beam is very localized and travels a short distance; there is no need for deflecting the electron beam, because it is the laser beam which is scanned. The charge transferred from the grid to the part under test by electron flow is detected and correlated with the position of the beam to provide an indication of the status of the conductive pattern. Undesired shorts or open circuit conditions among the conductors on the board is determined by comparing the charge transfer as a function of beam position with the desired standard pattern produced by a fault-free board.

23 Claims, 1 Drawing Sheet

ELECTRO-EMISSIVE LASER STIMULATED TEST

BACKGROUND OF THE INVENTION

This invention relates to methods for testing electrical devices, and more particularly to a testing arrangement for printed circuit boards or the like.

Electrical components such as printed (or etched) circuit boards must be tested after manufacture has been completed. The testing is primarily directed to determining whether or not all of the conductive paths are in their designated positions and no conductors are unintentionally shorted, and whether electrical continuity exists where it should. Various functional tests may be executed using the external connectors (those included for operation in the end equipment), and also visual inspection can provide an indication of the quality of the part. Such methods can be time-consuming and expensive, however, and in any event are not always effective in discovering shorts or opens which may be hidden form view or not exercised in the electrical functional tests chosen. For these reasons, various other test mechanisms have been proposed which perform the function of scanning the surface of a etched circuit board and providing an indication of the wiring integrity.

Electron beam technology is used to scan an integrated circuit chip or an etched circuit board under test while detecting secondary electrons emitted by the pattern on the board. One of these methods is referred to a Voltage Contrast Electron Beam (VCEB) technique; these testers are like logic analyzers which probe functional electronic circuits on semiconductor integrated circuit chips. The VCEB technique is described by Woodard et al, J. Vac. Sci. Technol., Nov./Dec. 1988, p. 1966, "Voltage Contrast Electron Beam Testing Experiments on Very Large Scale Integrated Circuit Chip Packaging Substrates". When used for testing relatively large devices, the VCEB technique requires complex and expensive electron beam deflecting arrangement, as well as requiring a large evacuated chamber.

Another testing method using a scanned E-beam is described in Abstract No. 129, Extended Abstracts, The Electrochemical Society, Spring Meeting, May 10-15, 1987, Vol. 87-1, p. 185, by Paul May et al, "Laser Pulsed E-Beam System for High-Speed I.C. Testing"; May et al describe an instrument for non-invasive testing using a laser beam impinging upon a gold-coated quartz photocathode to produce an electron beam, but again the electron beam must travel a large distance and must be focused and scanned by some intervening mechanism.

A laser beam is used instead of an electron beam in a test method shown by A. M. Weiner et al, "Picosecond Temporal Resolution Photoemissive Sampling", Applied Physics Letters, May 1987. Emission of electrons from a part under test at the point where the laser beam impinges is detected. A similar test method is shown by R. B. Marcus et al, "High-Speed Electrical Sampling by fs Photoemission", Applied Physics Letters, Aug. 11, 1986, p. 357, where a method for contactless probing of high-speed electrical waveforms, by spectral analysis of the photoelectrons emitted when a signal-carrying electrical conductor is illuminated by ultrashort laser light pulses.

In a copending application Ser. No. 424,624, filed Oct. 20, 1989 by Ellsworth W. Stearns, for "Single-Probe Charge Measurement Testing Method", assigned to Digital Equipment Corporation, a testing method is disclosed which uses the charging and discharging of nodes on a printed circuit board or the like by a probe physically touching the nodes. The current resulting from this charging is observed to determine whether the correct X-Y pattern is exhibited for charging these nodes.

SUMMARY OF THE INVENTION

In accordance with one embodiment of the invention, a test arrangement for small electrical parts such as etched circuits or integrated circuits employs a scanned laser beam to produce a tiny, localized electron beam. The electron beam is produced by impinging the laser beam upon a grid which immediately overlies (but is spaced from) the part under test. The grid is coated with an electro-emissive material to produce the localized electron beam. The localized emission of electrons produced by the laser beam merely functions as a "switch" to connect a charging source to selectively charge the nodes on the circuit board so the integrity of the nodes can be checked. Thus, an electron beam can be used for charging, but the electron beam as such need not be scanned; instead the laser beam is scanned, which is much easier to accomplish. Also, the detection mechanism employed does not rely upon secondary emission, so the distance travelled by emitted electrons (from the workpiece) no longer becomes a factor which reduces resolution. The localized electron beam is accelerated toward the workpiece by an electric field, so circuit nodes on the device under test are charged, and this charging is measured and correlated with beam position to provide an indication of circuit integrity. One way of detecting the charging of nodes is by measuring the current in the voltage supply which is applying the electric field. Another is to reverse the electric field and thus accelerate the electron packets back to the grid, and record the charge on the grid by either a CCD type of electrical readout from the grid, or photographically, since the grid can be made to glow in response to beam current.

BRIEF DESCRIPTION OF THE DRAWINGS

The novel features believed characteristic of the invention are set forth in the appended claims. The invention itself, however, as well as other features and advantages thereof, will be best understood by reference to the detailed description of specific embodiments which follows, when read in conjunction with the accompanying drawings, wherein:

DETAILED DESCRIPTION OF SPECIFIC EMBODIMENT

Figure 1:
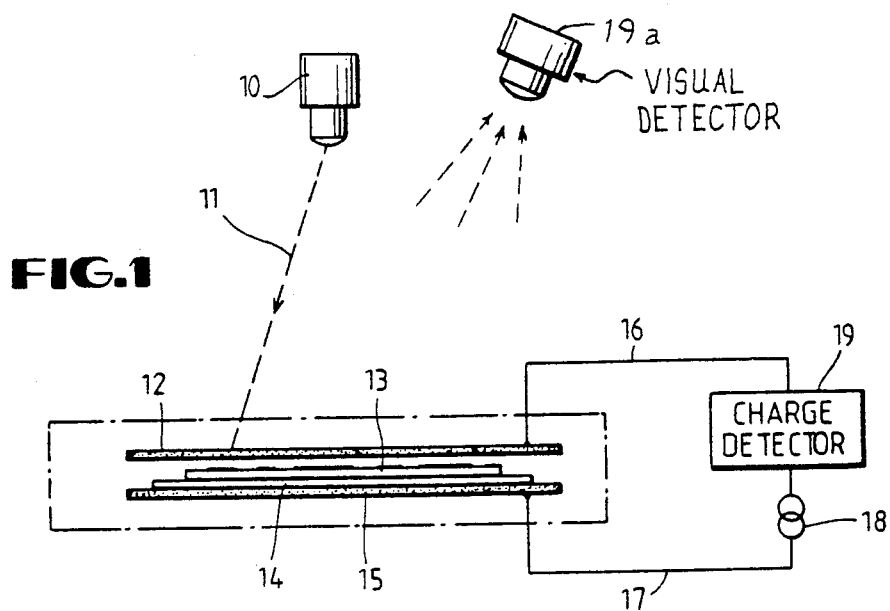
FIG. 1 is an elevation view of a test arrangement for printed circuit boards or the like, according to one embodiment of the invention.
Figure 2:
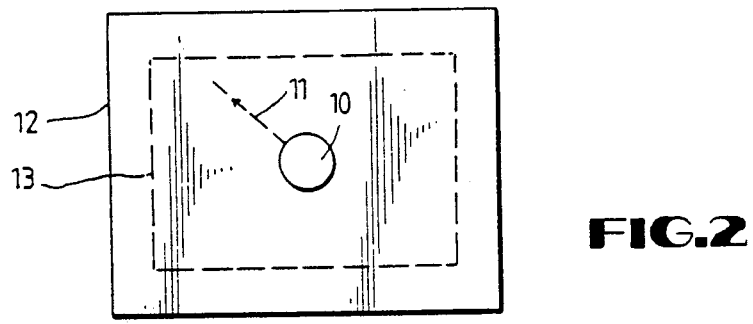
FIG. 2 is a plan view of the apparatus of FIG. 1 showing the grid and printed wiring board as scanned by a laser beam.

Referring to FIGS. 1 and 2, a test arrangement for printed wiring boards or the like is illustrated according to one embodiment of the invention. A laser source 10 generates a laser beam 11 for scanning across a rectangular grid 12. The laser source may be itself rotatable to generate the scan, or the laser may be fixed and a scanning mirror may be included to move the beam in the desired pattern, for example in a raster scan over the rectangular grid 12. Alternatively, the workpiece may be mechanically indexed in an X-Y direction to generate the scan, while the laser remains in a fixed position. The beam may be modulated, i.e., turned on and off during the scan, so that areas of the workpiece where it is known there are no nodes to test may be omitted from the scan. The item 13 under test is a printed wiring board, or integrated circuit chip, or IC package, or the like, positioned parallel to and closely adjacent to the grid 12. The board 13 is held by an insulating base 14, if necessary, and a second grid or conductive plane 15 underlies the workpiece. Alternatively, the conductive plane 15 may actually form part of the workpiece itself; for example, if the circuit board is of the doublesided type, the test would be run twice, once with one side up and again with the other side up, and in this case the grid 15 would be incorporated as a layer within the circuit board itself. An electric field is established between the grid 12 and the plane 15 by conductors 16 and 17 connected to these elements, to which a voltage supply 18 is coupled through a suitable detector 19; in one embodiment, the detector 19 may be merely an oscilloscope synched with the raster scan of the beam 11, or similar such means to detect current flow caused by electron emission from the grid. The grid 12 is coated with a photo-electro-emissive material so that, when the laser beam 11 impinges upon a local area of the grid, electrons will be emitted. As disclosed in the afore-mentioned Marcus et al article, a thin layer of gold which has been photochemically roughened is a good electro-emissive coating. The grid 12 may be a fine wire mesh, or it may comprise a glass plate coated on the lower side, with the laser beam penetrating through from the upper side. The electric field between the grid 12 and plane 15 attracts the emitted electrons, so the emitted electrons are accelerated in the direction of the electric field, but where the board 13 is interposed between the grid 12 and the plane 15 there is a buildup of charge on any conductor on the board as the electrons impinge upon the conductor. In contrast, in areas of the part under test where there is no conductor, there will be little or no electron flow from the grid 12 due to the insulative character of the part 13. The assembly of FIG. 1 is enclosed in a chamber 20 which is evacuated to facilitate electron flow and maintenance of the charge on the nodes, or alternatively filled at low pressure with a halogen gas which causes a visible glow for detecting charging of nodes; the chamber may indeed contain merely ambient air, in which case electron flow would be by plasma or arcing but the length of time that a node held a charge would be less.

The spacing between the local emission of electrons from the grid 12 and the conductive paths on the board 13 is small compared to the length of the laser beam 11 between the source 10 and the grid 12.

Figure 3:
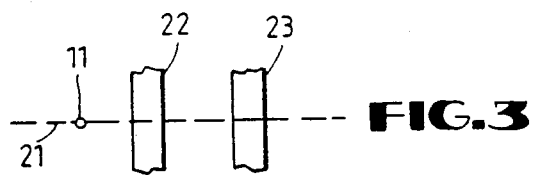
FIG. 3 is a plan view of a small portion of the test arrangement of FIGS. 1 and 2 showing the scan of a laser beam across two conductors on a printed wiring board.
Figure 3A:
FIGS. 3a and 3b are timing diagrams showing events vs. time for events occurring in the test arrangement of FIGS. 1 and 2, correlated with the beam scan of FIG. 3.
Figure 3B:

Referring to FIG. 3, as the laser beam 11 scans along the grid 12 in a path 21, the positions of two conductors 22 and 23 on the part 13 below are intercepted. These conductors 22 and 23 are thin metallization films as would be present on an etched circuit board, an integrated circuit chip, or the like. FIG. 3a shows the charge transfer or current detected by the detector 19 as a function of the position of the beam 11, and it is seen that a pulse 24 or 25 is produced for each of these conductors 22 and 23; the height and width of these pulses 24 and 25 are related to the size and shape of each conductor and all of the metallization to which the node has a low-resistance connection, and it is seen that the pulses rise sharply on their leading edge then decay as the node formed by the particular conductor becomes charged to the maximum level permitted by the electric field and electron current supply generated by the photoemissive material on the grid 12. The pulses 24 and 25 of FIG. 3a assume that the two conductors 22 and 23 are separate nodes, not connected together, and the nodes are of about the same size and shape. FIG. 3b shows the same plot, but assuming the two conductors 22 and 23 are electrically shorted (intentionally or unintentionally); in this case a pulse 26 is observed which is larger (higher and/or wider) representing the amount of charge needed to supply the entire conductive path connected to both conductors 22 and 23.

The charge built up on the conductors in the technique of FIGS. 1 and 2 may also be detected by reversing the voltage applied between the grid 12 and the plate 15 then observing the photo-emissive glow produced from the grid 12 by the flow of electrons back to the grid. During this detection step, the laser beam would be turned off. The glow would be recorded photographically by means 19a and the record compared to a reference photograph produced by a part 13 known to be without faults. If a node exhibited a higher or lower amount of glow (charge) than the reference, a fault is indicated.

Figure 4:
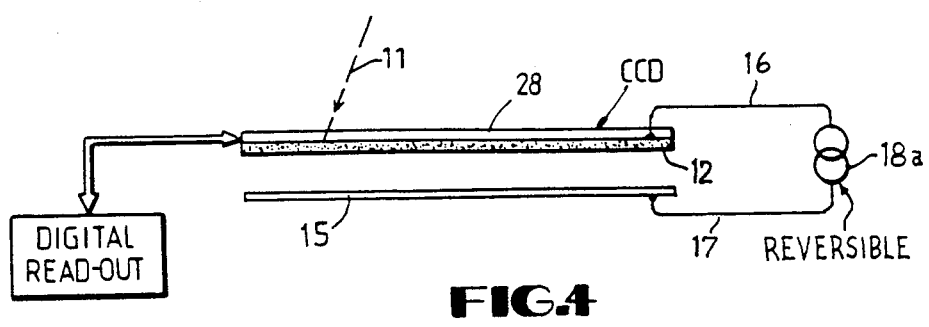
FIG. 4 is an elevation view corresponding to FIG. 1 according to another embodiment of the invention.

Referring to FIG. 4, another method of detecting the charge transfer by the localized electron emission is to reverse the electric field by reversing the voltage applied between the grid 12 and the plate 15 so that the charge packets on the nodes of the part 13 will be attracted back toward the grid 12; a CCD array 28 is positioned parallel to the grid 12 and is used to read out the pattern of return of electron flow when the electric field is reversed by reversible voltage supply 18a. The CCD array may be made transparent to the laser beam (if the plate is above the grid 12) or transparent to the emitted electrons (if the CCD is below the grid 12) by constructing the CCD array of a silicon chip that is of relatively low cell density and providing through-holes etched through the chip. Alternatively, the CCD array may be a silicon chip or wafer which itself forms the grid 12, e.e., has a coating on its underside to emit electrons, and is essentially transparent to the laser beam, while also having an array of detector/memory cells formed on the upper side. This electrical read-out by the CCD 28 provides a bit-mapped representation of the charge packets on the nodes of the part 13, and this representation can be compared with a reference bit-mapped representation in memory for a part with no faults; any differences can be displayed as a graphic image, or faults identified by a digital printout from a computer.

While this invention has been described with reference to specific embodiments, this description is not meant to be construed in a limiting sense. Various modifications of the disclosed embodiments, as well as other embodiments of the invention, will be apparent to persons skilled in the art upon reference to this description. It is therefore contemplated that the appended claims will cover any such modifications or embodiments as fall within the true scope of the invention.

What is claimed is:

1. Apparatus for testing an electrical part having a plurality of conductive paths thereon, comprising:
   (a) means for directing a laser beam to impinge upon a grid and for scanning said laser beam in a pattern across said grid, said grid being spaced from said part;
   (b) said grid generating a local emission of electrons where impinged by said laser beam, said emission of electrons being attracted toward said conductive paths by an electric field;
   (c) detector means responsive to the amount of charge transferred by said emission of electrons as said laser beam is scanned in said pattern across said grid.

2. Apparatus according to claim 1 wherein said grid has a photoemissive material thereon to generate said emission of electrons.

3. Apparatus according to claim 1 wherein said electric field is created between said grid and a conductive plane within or behind said part.

4. Apparatus according to claim 1 wherein said detector means includes means for reversing the polarity of said electric field between said grid and said conductive pattern, and includes means for recording the effect of electron flow from said part back toward said grid as a result of said reversing.

5. Apparatus according to claim 1 wherein said means for scanning includes means for deflecting a laser beam in a raster scanning pattern.

6. A method of testing a device having a plurality of conductive paths thereon, comprising the steps of:
   (a) directing a laser beam to impinge upon a grid spaced from said device and scanning said laser beam in a pattern across said grid;
   (b) generating by said grid from said laser beam a local emission of electrons for flow to said conductive paths across an electric field between said grid and said device;
   (c) detecting the amount of charge transferred by said emission of electrons as said laser beam is scanned in said pattern across said grid.

7. A method according to claim 6 wherein said step of generating is by a photoemissive grid extending over said part but spaced therefrom.

8. A method according to claim 6 wherein electric field is formed between a grid and a conductive plane within or behind said part.

9. A method according to claim 8 wherein said step of detecting is by measuring current flow from said grid.

10. A method according to claim 6 wherein the spacing between said local emission and said conductive paths is small compared to the length of said laser beam.

11. A method according to claim 6 wherein said laser beam is deflected in a regular pattern to scan said grid.

12. A method of testing a device having a plurality of conductive paths thereon, comprising the steps of:
   (a) directing a laser beam to impinge upon an electro-emissive grid and scanning said laser beam in a pattern over said electro-emissive grid, said grid being positioned near said device and extending generally parallel to a major face of said device;
   (b) generating from grid where impinged by said laser beam a local emission of electrons for charging local areas of said conductive paths under influence of an electric field;
   (c) detecting the amount of charge transferred by said emission of electrons as a function of the position of said laser beam.

13. A method according to claim 12 wherein said electric field is formed between said grid and a conductive plane within or behind said device.

14. A method according to claim 13 wherein said step of detecting is by measuring current flow between said grid and said plane.

15. A method according to claim 12 wherein the spacing between said grid and said conductive paths is small compared to the length of said laser beam.

16. Apparatus for testing an electrical part having a plurality of conductive paths thereon, comprising:
   (a) a laser beam generator producing a laser beam impinging upon a grid positioned near said part, said laser beam moving in a pattern across said grid;
   (b) said grid having an electro-emissive material thereon for generating a local emission of electrons where impinged by said laser beam, said emission of electrons being attracted toward said conductive paths by an electric field; and
   (c) detecting means responsive to the amount of charge transferred by said emission of electrons as a function of the position of said laser beam.

17. Apparatus according to claim 16 wherein said electric field is created between said grid and a conductive plane within or behind said part.

18. Apparatus according to claim 16 wherein part is a printed wiring board or the like.

19. Apparatus according to claim 16 including means for scanning said laser beam by deflecting the laser beam in a raster scanning pattern.

20. Apparatus according to claim 19 including means for scanning said laser beam by moving said part in an X-Y pattern.

21. Apparatus according to claim 16 wherein said detecting means includes a detector in series with a voltage supply applied to said grid.

22. Apparatus according to claim 16 wherein said detecting means includes means for detecting photo-emissive glow of said grid after reversing said electric field.

23. Apparatus according to claim 16 wherein said detecting means includes means for electrically scanning said grid to detect photo-emission by the grid after reversing said electric field.

* * * * *